(12) United States Patent
Wu et al.

(10) Patent No.: US 7,764,101 B2
(45) Date of Patent: Jul. 27, 2010

(54) SCHMITT-TRIGGER-BASED LEVEL DETECTION CIRCUIT

(75) Inventors: Jeng-Huang Wu, Hsinchu (TW); Sheng-Hua Chen, Kaohsiung (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 17 days.

(21) Appl. No.: 12/357,965

(22) Filed: Jan. 22, 2009

(65) Prior Publication Data

US 2009/0189665 A1   Jul. 30, 2009

(30) Foreign Application Priority Data

Jan. 28, 2008   (TW) ............................. 97103186 A

(51) Int. Cl.
*H03K 3/12* (2006.01)
(52) U.S. Cl. ...................................... 327/205; 327/206
(58) Field of Classification Search ................. 327/205, 327/206
See application file for complete search history.

(56) References Cited

U.S. PATENT DOCUMENTS

| | | | | |
|---|---|---|---|---|
| 3,984,703 A | | 10/1976 | Jorgensen | |
| 5,874,844 A | * | 2/1999 | Shin | 327/206 |
| 6,441,663 B1 | | 8/2002 | Chuang et al. | |
| 6,448,830 B1 | * | 9/2002 | Chuang et al. | 327/205 |
| 6,549,048 B2 | * | 4/2003 | Tailliet | 327/205 |
| 6,700,424 B2 | * | 3/2004 | Feng | 327/206 |
| 6,870,413 B1 | * | 3/2005 | Chang et al. | 327/205 |
| 2005/0104641 A1 | * | 5/2005 | Chen et al. | 327/205 |
| 2006/0017482 A1 | * | 1/2006 | Chauhan et al. | 327/205 |
| 2009/0066388 A1 | * | 3/2009 | Park | 327/206 |

\* cited by examiner

*Primary Examiner*—Tuan Lam
(74) *Attorney, Agent, or Firm*—Winston Hsu

(57) ABSTRACT

A Schmitt trigger includes A first PMOS transistors having the drains and sources thereof serially connected and coupled between a voltage source and an output end, and having gates thereof coupled to an input end; B first NMOS transistors having the drains and sources thereof serially connected and coupled between the output end and ground, and having gates thereof coupled to the input end; C second PMOS transistors, each being coupled between ground and a node between the drain and the source of the first PMOS transistors and having the gate thereof coupled to the output end; and D second NMOS transistors, each being coupled between the voltage source and a node between the drain and the source of the first NMOS transistors and having the gate thereof coupled to the output end. A is greater than 2 and C, and B is greater than 2 and D.

6 Claims, 9 Drawing Sheets

SCHMITT-TRIGGER-BASED LEVEL DETECTION CIRCUIT

FIELD OF THE INVENTION

The present invention relates to a Schmitt trigger, and more particularly to a Schmitt-trigger-based level detection circuit with adjustable hysteresis.

BACKGROUND OF THE INVENTION

For overcoming the current leakage problem encountered in an advanced manufacturing process, a design with multi-domain-voltage islands becomes a mainstream in the art. As such a design requires frequent power on/off transitions, a power-detecting module is generally provided for each domain of the multi-domain-voltage islands to facilitate normal operation of each domain in the power-on state. The power-detecting module is principally used for detecting the power supply state.

Generally speaking, power switches for multi-domain-voltage islands include a header type and a footer type of switches. A header-type power switch consists of PMOS transistors, while the footer-type power switch consists of NMOS transistors. Furthermore, the header-type power switch is coupled to a power source and a virtual power source, while the footer-type power switch is coupled to ground and virtual ground.

For example, in the header-type power switch, when a voltage from a power supply passes through the PMOS transistor switch so that the virtual power increases to a level of 90% or above the power voltage (Vcc), the power-detecting module will generate and output a first power-ready signal to an integrated circuit for normal operations of all elements in the integrated circuit. On the other hand, in the footer-type power switch, when a voltage from a power supply passes through the NMOS transistor switch so that the virtual ground decreases to a level of 10% or below the power voltage (Vcc), the power-detecting module will generate and output a second power-ready signal to an integrated circuit to indicate the suspension of power voltage (Vcc) from the power supply.

In order for the power-detecting module to accurately measure the power voltage (Vcc) from the power supply, a level-detecting circuit included in the power-detecting module is used for detecting the voltage level from the power supply. A general level-detecting circuit is implemented with an analog circuit, and is thus disadvantageous in some aspects, e.g. large layout area, high DC current consumption, high IC design cost, etc. Alternatively, the level-detecting circuit can be implemented with a digital circuit. In the digital circuitry, equivalent resistance and capacitance in the power supply are calculated first and then used for calculating an RC time constant. Afterwards, a digital counter measures the charge/discharge time after the power on/off operation so as to opportunely generate the first/second power-ready signal.

A further attempt is to use a Schmitt trigger which is simple in structure and exhibits a hysteresis transfer function as the level-detecting circuit.

Please refer to FIG. 1 which schematically illustrates a conventional Schmitt trigger as disclosed in U.S. Pat. No. 3,984,703. The Schmitt trigger includes three NMOS transistors 14, 18 and 19 and three PMOS transistors 13, 16 and 17. The Schmitt trigger has an input end (in) coupled to gates of the NMOS transistors 14 and 19 and the PMOS transistors 13 and 16. The source of the PMOS transistor 16 is coupled to a voltage source Vcc and the drain is coupled to a node 21. The node 21 is further coupled to the source of the PMOS transistor 13 which has the drain coupled to an output end (out). The output end (out) is coupled to the drain of the NMOS transistor 14 which has the source coupled to a node 22. The node 22 is further coupled to the drain of the NMOS transistor 19 which has the source grounded. Furthermore, the source of the PMOS transistor 17 is coupled to the node 21, the gate is coupled to the output end (out), and the drain is coupled to ground. On the other hand, the source of the NMOS transistor 18 is coupled to the node 22, the gate is coupled to the output end (out), and the drain is coupled to the voltage source Vcc.

Please refer to FIG. 2 which is a plot showing a hysteresis transfer function of the Schmitt trigger of FIG. 1. Assuming that the voltage Vcc is 10V, the threshold voltage of the NMOS transistors is a positive value Vthn, and the threshold voltage of the PMOS transistors is a negative value Vthp, then:

(I) If the input has a voltage lying between 0 and Vthn, the PMOS transistors 13 and 16 and the NMOS transistor 18 are turned on while the PMOS transistor 17 and the NMOS transistors 14 and 19 are turned off; meanwhile, the output end has a voltage equal to Vcc, and the node 22 has a voltage equal to (Vcc−Vthn);

(II) When the voltage at the input end rises and lies in a range between Vthn and Vcc/2+Vthn, the PMOS transistors 13 and 16 and the NMOS transistors 18 and 19 are turned on while the PMOS transistor 17 and the NMOS transistor 14 are turned off; meanwhile, the output end has a voltage equal to Vcc, and the node 22 has a voltage equal to (Vcc/2);

(III) When the voltage at the input end further rises and lies in a range between Vcc/2+Vthn and Vcc, the PMOS transistor 17 and the NMOS transistors 14 and 19 are turned on while the PMOS transistors 13 and 16 and the NMOS transistor 18 are turned off; meanwhile, the output end has a 0 voltage, and the node 21 has a voltage equal to −Vthp;

(IV) If the input has a voltage lying between Vcc and Vcc+Vthp, the NMOS transistors 14 and 19 and the PMOS transistor 17 are turned on while the PMOS transistors 16 and 13 and the NMOS transistor 18 are turned off; meanwhile, the output end has a 0 voltage, and the node 21 has a voltage equal to −Vthp;

(V) When the voltage at the input end falls and lies in a range between Vcc+Vthp and Vcc/2+Vthp, the NMOS transistors 14 and 19 and the PMOS transistors 16 and 17 are turned on while the PMOS transistor 13 and the NMOS transistor 18 are turned off; meanwhile, the output end has a 0 voltage, and the node 21 has a voltage equal to Vcc/2; and (VI) When the voltage at the input end further falls and lies in a range between Vcc/2+Vthp and 0, the PMOS transistors 13 and 16 and the NMOS transistor 18 are turned on while the PMOS transistors 17 and the NMOS transistors 14 and 19 are turned off; meanwhile, the output end has a voltage equal to Vcc, and the node 22 has a voltage equal to Vcc−Vthn.

It is understood from FIG. 2 that when the input voltage increases from 0 to Vcc, the trip point V+ at the output end is Vcc/2+Vthn; and when the input voltage decreases from Vcc to 0, the trip point V− at the output end is Vcc/2+Vthp. Since the difference between the two trip points V+ and V− is defined as a hysteresis level, it is realized that the trip point V− is around 0.3 Vcc and the trip point V+ is around 0.7 Vcc. Unfortunately, for using a Schmitt trigger as the level-detecting circuit of the power-detecting module, it is required that the trip points V− and V+ are at least low to 0.1 Vcc and up to 0.9 Vcc.

U.S. Pat. No. 6,870,413 discloses a Schmitt trigger circuit with adjustable trip point voltages, as illustrated in FIG. 3. The Schmitt trigger includes a NOT gate 180, an inverter stage 120, two NMOS transistor control circuits, two PMOS transistor control circuits, two NMOS transistors T0 and T1, and two PMOS transistors T4 and T5. The Schmitt trigger has an input end (VIN) coupled to gates of the NMOS transistors T0 and T1 and the PMOS transistors T4 and T5. The source of the PMOS transistor T4 is coupled to the voltage source Vcc and the drain is coupled to a node 140. The node 140 is further coupled to the source of the PMOS transistor T5 which has the drain coupled to a node 130. The node 130 is coupled to the drain of the NMOS transistor T1 which has the source coupled to a node 150. The node 150 is coupled to the drain of the NMOS transistor T0 which has the source coupled to ground Vss. Furthermore, the node 130 is coupled to the input end of the inverter stage 120 which has an output end serving as the output end (VOUT) of the Schmitt trigger.

Furthermore, the Schmitt trigger includes a first NMOS transistor control circuit 160 including NMOS transistors T11 and T12, wherein the drain of the NMOS transistor T12 is coupled to the voltage source Vcc and the gate and the source are coupled to the node 130 and the drain of the NMOS transistor T11, respectively. The gate of the NMOS transistor T11 is coupled to an output end /VCCSEL of the NOT gate 180 and the source is coupled to the node 150. The Schmitt trigger further includes a second NMOS transistor control circuit 165 including NMOS transistors T13 and T14, wherein the drain of the NMOS transistor T14 is coupled to the voltage source Vcc and the gate and source are coupled to the node 130 and the drain of the NMOS transistor T13. The gate of the NMOS transistor T13 is coupled to a selection end VCCSEL of the NOT gate 180 and the source is coupled to the node 150.

Furthermore, the Schmitt trigger includes a first PMOS transistor control circuit 170 including PMOS transistors T9 and T10, wherein the drain of the PMOS transistor T10 is coupled to ground Vss and the gate and the source are coupled to the node 130 and the drain of the PMOS transistor T9, respectively. The gate of the PMOS transistor T9 is coupled to the selection end VCCSEL of the NOT gate 180 and the source is coupled to the node 140. The Schmitt trigger further includes a second PMOS transistor control circuit 175 including PMOS transistors T7 and T8, wherein the drain of the PMOS transistor T8 is coupled to ground Vss and the gate and the source are coupled to the node 130 and the drain of the PMOS transistor T7, respectively. The gate of the PMOS transistor T7 is coupled to the output end /VCCSEL of the NOT gate 180 and the source is coupled to the node 140.

In the Schmitt trigger circuitry, the first NMOS transistor control circuit 160 and the second NMOS transistor control circuit 165, which exhibit different conductivity parameters, and the first and second PMOS transistor control circuits 170 and 175 also with different conductivity parameters are provided. By selectively enabling the first and second NMOS transistor control circuits 160 and 165 or the first and second PMOS transistor control circuits 170 and 175 through the selection end, the trip point of the Schmitt trigger may vary with the signal from the control end so as to impart two hysteresis transfer functions to the Schmitt trigger, as shown in FIG. 4A and FIG. 4B.

In another prior art, U.S. Pat. No. 6,441,663, SOI CMOS Schmitt trigger circuits with controllable hysteresis are proposed. Please refer to FIG. 5. The Schmitt trigger includes 5 NMOS transistors N1, N2, N3, N4 and N5, and 5 PMOS transistors P1, P2, P3, P4 and P5. In order to eliminate a so-called body effect of the transistors, the bodies of the NMOS transistors N1, N2 and N3 are coupled to ground, while the bodies of the PMOS transistors P1, P2 and P3 are coupled to voltage source Vdd. On the other hand, the bodies of the NMOS transistors N4 and N5 are coupled to the sources of the NMOS transistors N4 and N5, respectively, while the bodies of the PMOS transistors P4 and P5 are coupled to the sources of the PMOS transistors P4 and P5, respectively.

The Schmitt trigger further includes an input$ end VIN coupled to the gates of the NMOS transistors N1, N2 and N3 and the PMOS transistors P1, P2 and P3. Meanwhile, the source of the PMOS transistor P1 is coupled to the voltage source Vcc and the drain is coupled to a node "a". The node "a" is coupled to the source of the PMOS transistor P2 which has the drain coupled to a node "b". The node "b" is coupled to the source of the PMOS transistor P3 which has the drain coupled to an output end VOUT. The output end VOUT is coupled to the drain of the NMOS transistor N3 which has the source coupled to a node "c". The node "c" is coupled to the drain of the NMOS transistor N2 which has the source coupled to a node "d". The node "d" is coupled to the drain of the NMOS transistor N1 which has the source coupled to ground.

In the circuitry, the PMOS transistors P4 and P5 and the NMOS transistors N4 and N5 may function as feedback FETs. The Schmitt trigger utilizes two tires of feedback FETs to control two trip points, i.e. for both V+ and V−. The source of the PMOS transistor P5 is coupled to the node "b" and the gate and drain are coupled to the output end VOUT and ground, respectively. The source of the PMOS transistor P4 is coupled to the node "a" and the gate and drain are coupled to the source of the PMOS transistor P5 and ground, respectively. On the other hand, the source of the NMOS transistor N5 is coupled to the node "c" and the gate and drain are coupled to the output end VOUT and the voltage source Vcc, respectively. The source of the NMOS transistor N4 is coupled to the node "d" and the gate and drain are coupled to the source of the NMOS transistor N5 and the voltage source Vcc, respectively.

As the interconnection among the feedback FETs P4, P5, N4 and N5, while being turned on, is likely to result in voltage variation at the node "b" or "c", inaccurate trip points V+ and V− of the Schmitt trigger may thus occur. In other words, due to the connection of the gate of the PMOS transistor P4 to the source of the PMOS transistor P5, the voltage variation would have influence on the trip point V− at the node "b" when the PMOS transistors P4 and P5 are turned on. Likewise, due to the connection of the gate of the NMOS transistor N4 to the source of the NMOS transistor N5, the voltage variation would have influence on the trip point V+ at the node "c" when the NMOS transistors N4 and N5 are turned on. As a result, such a Schmitt trigger is not suitable to be a level detection circuit used in a power-detecting module.

SUMMARY OF THE INVENTION

Therefore, the present invention aims to provide a Schmitt trigger having two trip points as low as 0.1 Vcc and as high as 0.9 Vcc so as to be suitable for use in a level detection circuit of a power-detecting module.

The present invention provides a Schmitt trigger, which includes a number A of first PMOS transistors having the drains and sources thereof serially connected and coupled between a voltage source and an output end, and having gates thereof coupled to an input end; a number B of first NMOS transistors having the drains and sources thereof serially connected and coupled between the output end and ground, and having gates thereof coupled to the input end; a number C of second PMOS transistors functioning as feedback transistors, each of which is coupled between ground and a node between the drain and the source of the first PMOS transistors and has the gate thereof coupled to the output end; and a number D of second NMOS transistors functioning as feedback transistors, each of which is coupled between the voltage source and a node between the drain and the source of the first NMOS transistors and has the gate thereof coupled to the output end; wherein A is greater than 2 and greater than C, and B is greater than 2 and greater than D.

The present invention also provides a Schmitt trigger, which includes a number A of first PMOS transistors having the drains and sources thereof serially connected and coupled between a voltage source and an output end, and having gates thereof coupled to an input end; a number B of first NMOS transistors having the drains and sources thereof serially connected and coupled between the output end and ground, and having gates thereof coupled to the input end; a number C of second PMOS transistors functioning as feedback transistors, each of which is coupled to a node between the drain and the source of the first PMOS transistors and has the gate thereof coupled to the output end; a number D of second NMOS transistors functioning as feedback transistors, each of which is coupled to a node between the drain and the source of the first NMOS transistors and has the gate thereof coupled to the output end; and a switch control unit coupled to the drains of the second PMOS transistors and/or the drains of the second NMOS transistors for selectively connecting the drains of the second PMOS transistors to ground and/or selectively connecting the drains of the second NMOS transistors to the voltage source; wherein A is greater than 2 and greater than C, and B is greater than 2 and greater than D.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

Figure 6:
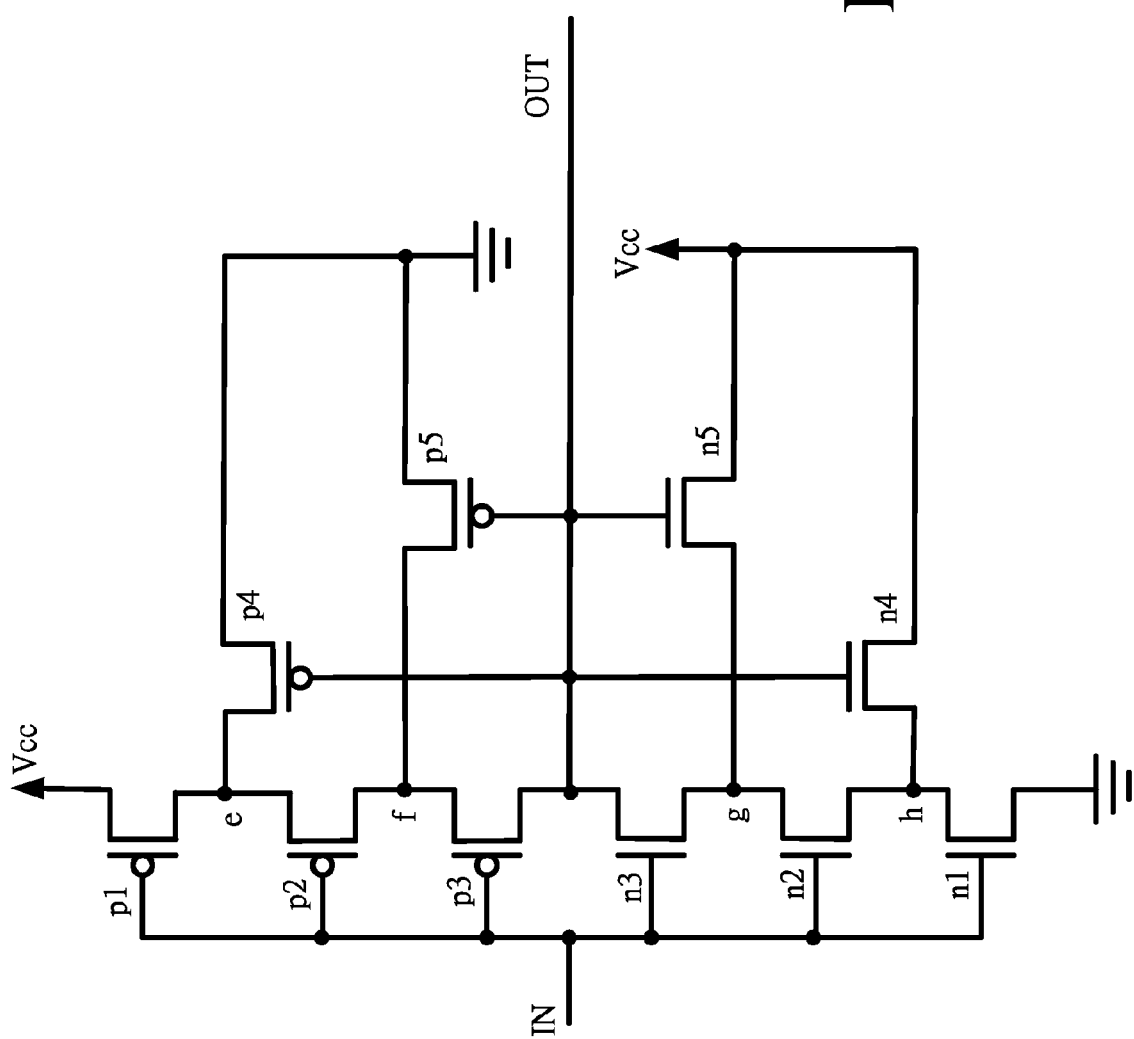
FIG. 6 is a circuit diagram illustrating an embodiment of a Schmitt trigger according to the present invention.

Please refer to FIG. 6 which illustrates a first embodiment of a Schmitt trigger according to the present invention. The Schmitt trigger includes 5 NMOS transistors n1, n2, n3, n4 and n5 and 5 PMOS transistors p1, p2, p3, p4 and p5. The Schmitt trigger has an input end IN coupled to gates of the NMOS transistors n1, n2 and n3 and the PMOS transistors p1, p2 and p3. The source of the PMOS transistor p1 is coupled to a power voltage Vcc and the drain is coupled to a node "e". The node "e" is further coupled to the source of the PMOS transistor p2 which has the drain thereof coupled to a node "f". The node "f" is further coupled to the source of the PMOS transistor p3 which has the drain thereof coupled to an output end (OUT). The output end (OUT) is further coupled to the drain of the NMOS transistor n3 which has the source thereof coupled to a node "g". The node "g" is further coupled to the drain of the NMOS transistor n2 which has the source thereof coupled to a node "h". The node "h" is further coupled to the drain of the NMOS transistor n1 which has the source thereof coupled to ground.

In the circuitry, the PMOS transistors p5 and p4 and the NMOS transistors n5 and n4 may function as feedback FETs. The Schmitt trigger utilizes two tires of feedback FETs to control two trip points, i.e. for both V+ and V−. The source of the PMOS transistor p5 is coupled to the node "f" and the gate and drain are coupled to the output end OUT and ground, respectively. The source of the PMOS transistor p4 is coupled to the node "e" and the gate and drain are coupled to the output end OUT and ground, respectively. On the other hand, the source of the NMOS transistor n5 is coupled to the node "g" and the gate and drain are coupled to the output end OUT and the voltage source Vcc, respectively. The source of the NMOS transistor n4 is coupled to the node "h" and the gate and drain are coupled to the output end OUT and the voltage source Vcc, respectively.

Figure 1:
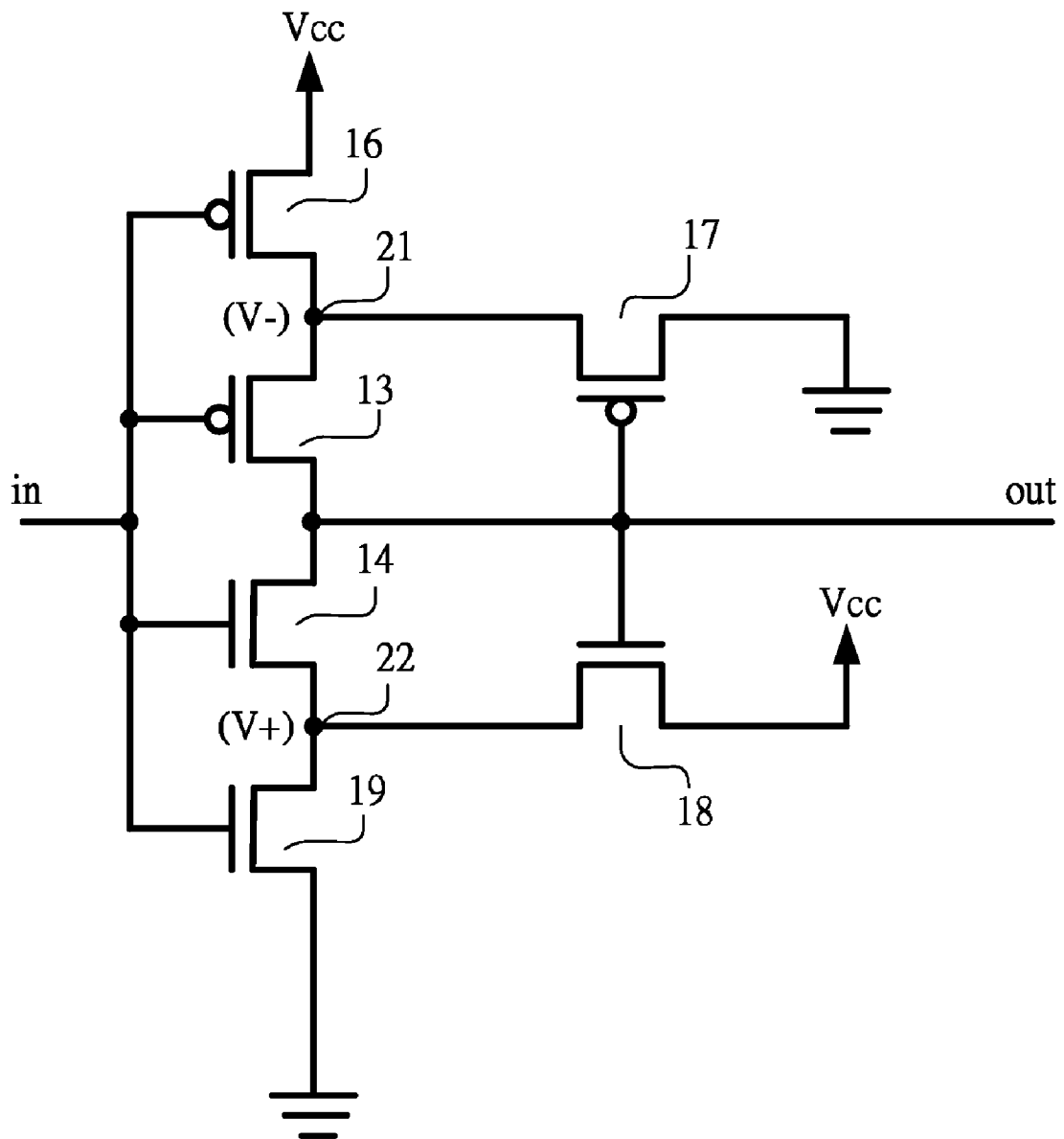
FIG. 1 is a circuit diagram illustrating a conventional Schmitt trigger.
Figure 2:
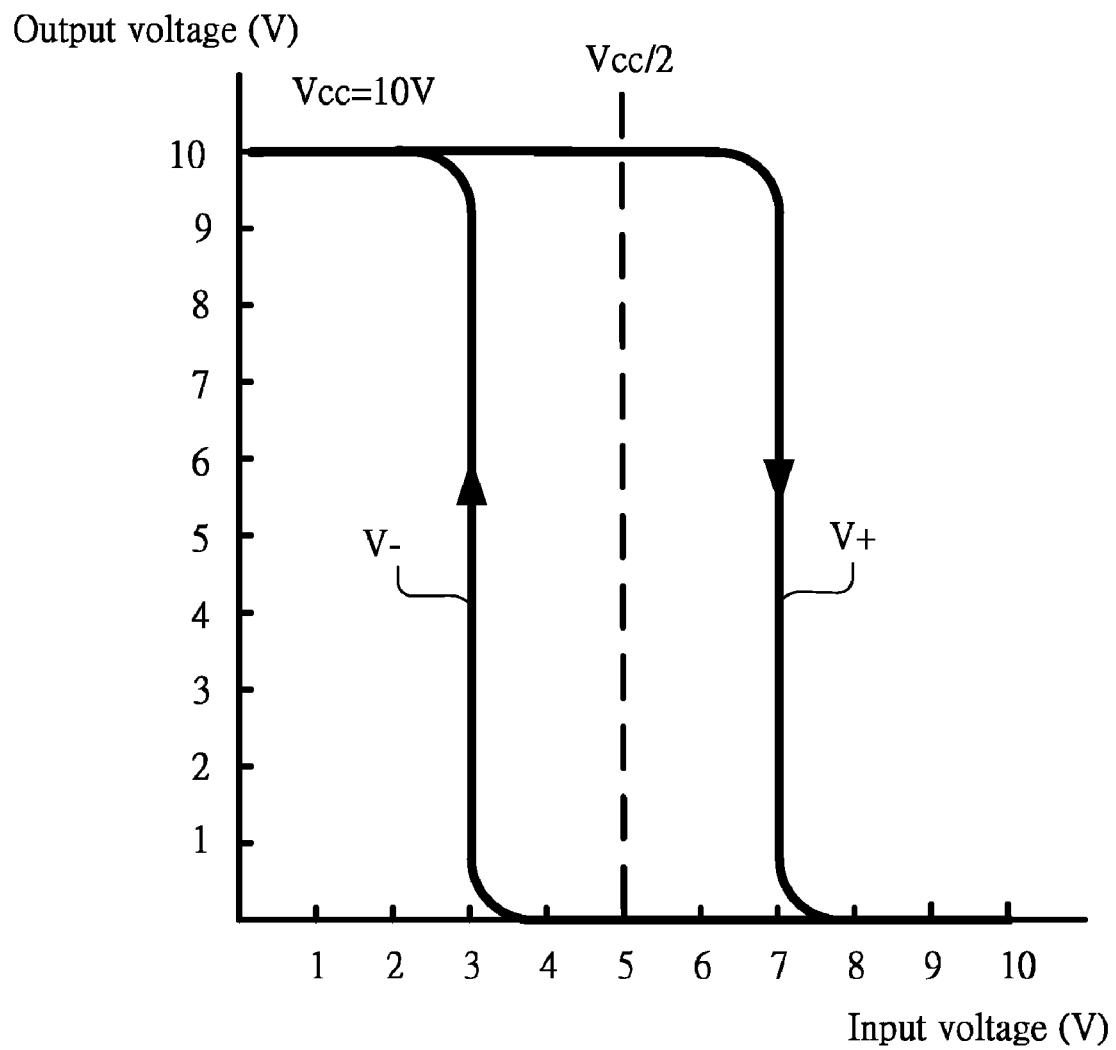
FIG. 2 is a plot illustrating a hysteresis transfer function of the Schmitt trigger of FIG. 1.
Figure 3:
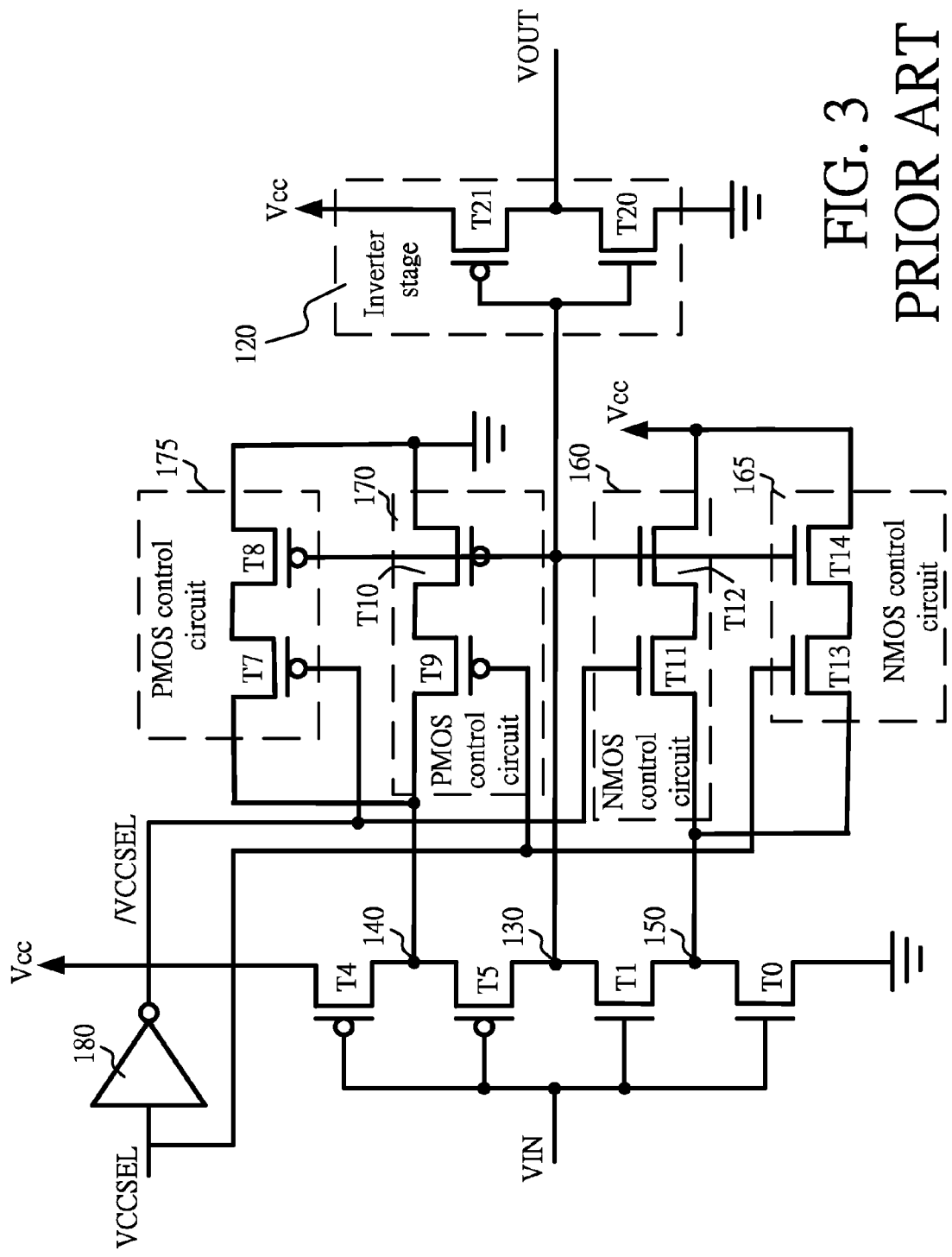
FIG. 3 is a circuit diagram illustrating another conventional Schmitt trigger.
Figure 4A:
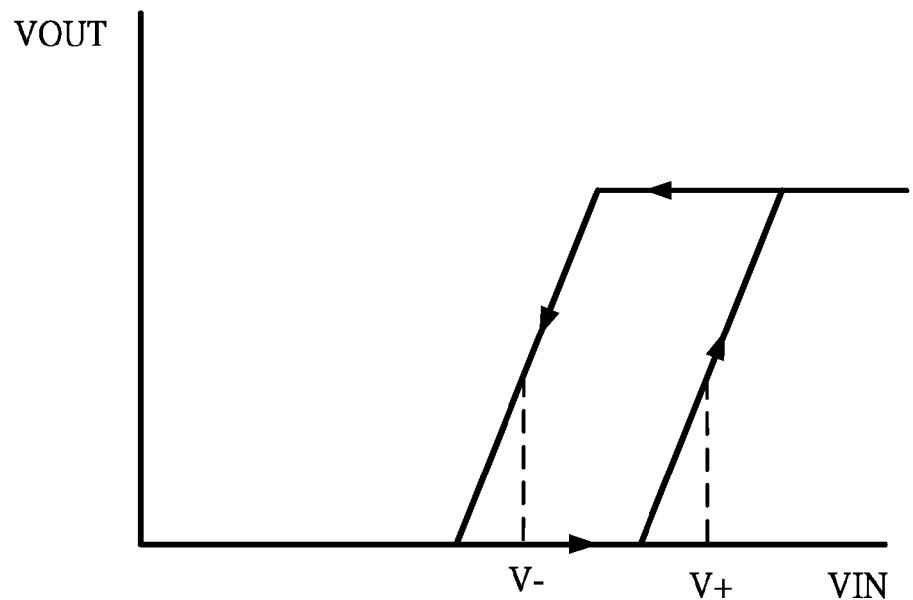
FIGS. 4A and 4B are plots illustrating hysteresis transfer functions of the Schmitt trigger of FIG. 3.
Figure 4B:
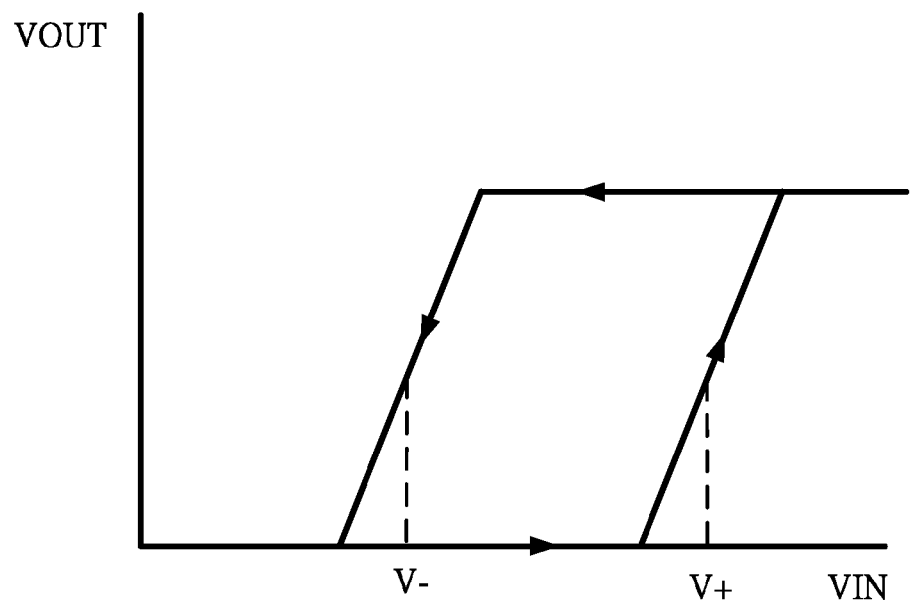
Figure 5:
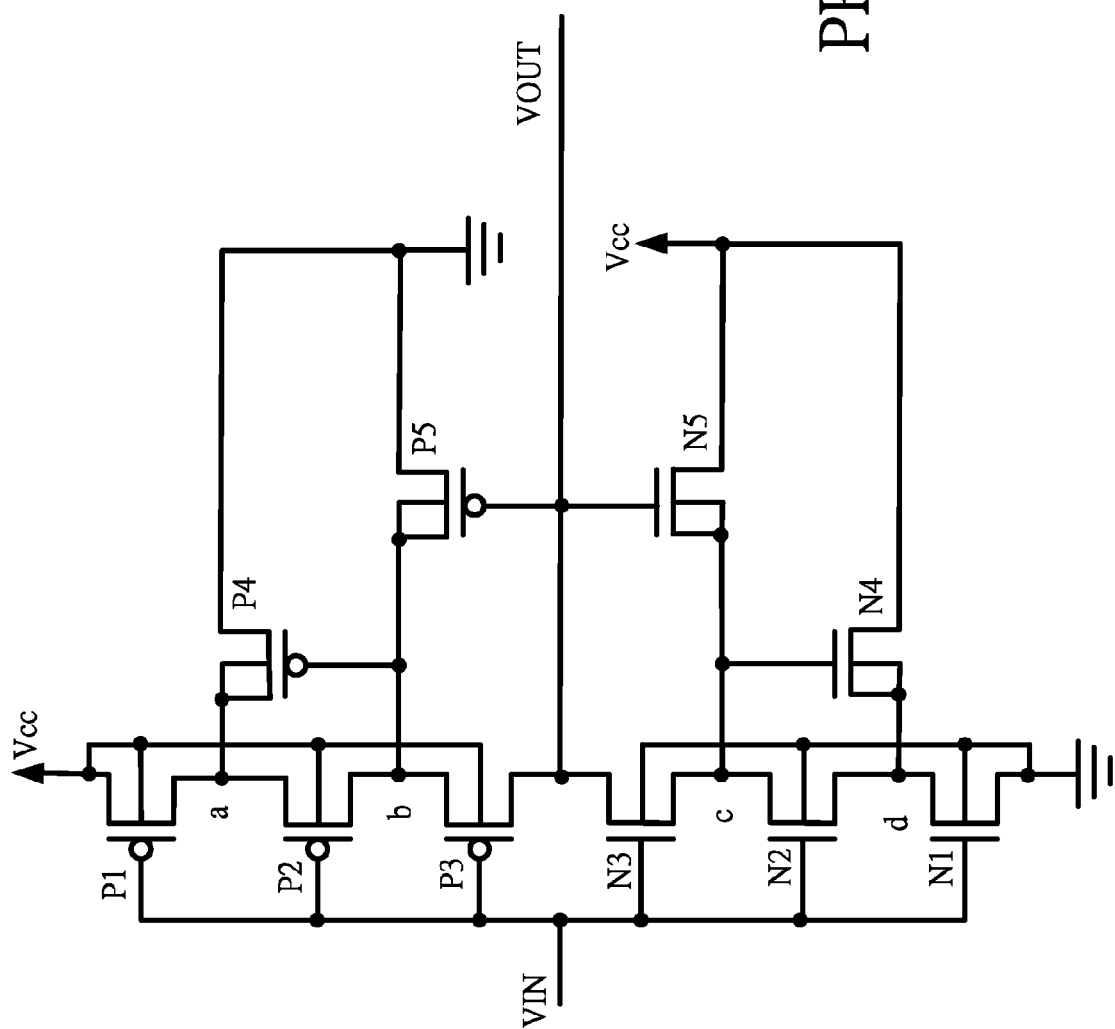
FIG. 5 is a circuit diagram illustrating a further conventional Schmitt trigger.

The above embodiment of Schmitt trigger differs from the Schmitt trigger shown in FIG. 5 at least in the coupling states of the NMOS transistor n4 and the PMOS transistor p4, wherein the gates of the NMOS transistor n4 and the PMOS transistor p4 are both coupled to the output end OUT. In other words, when the NMOS transistor n4 and the PMOS transistor p4 are turned on, the voltage at the node "f" and the node "g" is relative stable so that the trip points V+ and V− of the Schmitt trigger are relatively accurate. Therefore, the Schmitt trigger is suitable to be used in a level detection circuit of a power-detecting module.

Assuming all the NMOS transistors included in the above embodiment of Schmitt trigger have a positive threshold voltage Vthn and all the PMOS transistors have a negative threshold voltage Vthp, then:

(I) If the input has a voltage lying between 0 and Vthn, the PMOS transistors p1, p2 and p3 and the NMOS transistors n4 and n5 are turned on while the PMOS transistors p4 and p5 and the NMOS transistors n1, n2 and n3 are turned off; meanwhile, the output end has a voltage equal to the power voltage Vcc, and the nodes "h" and "g" have a voltage equal to (Vcc−Vthn);

(II) When the voltage at the input end rises and lies in a range between Vthn and Vcc/2+Vthn, the PMOS transistors p1, p2 and p3 and the NMOS transistors n1, n4 and n5 are turned on while the PMOS transistors p4 and p5 and the NMOS transistors n2 and n3 are turned off; meanwhile, the output end has a voltage equal to Vcc, the node "h" has a voltage equal to (Vcc/2), and the node "g" has a voltage equal to (Vcc−Vthn);

(III) When the voltage at the input end further rises and lies in a range between Vcc/2+Vthn and (⅘)*Vcc+Vthn, the PMOS transistors p1, p2 and p3 and the NMOS transistors n1, n2, n4 and n5 are turned on while the PMOS transistors p4 and p5 and the NMOS transistor n3 are turned off; meanwhile, the output end has a voltage equal to Vcc, the node "h" has a voltage equal to (⅗)*Vcc, and the node "g" has a voltage equal to (⅘)*Vcc;

(IV) When the voltage at the input end further rises and lies in a range between (4/5)*Vcc+Vthn and Vcc, the PMOS transistors p4 and p5 and the NMOS transistors n1, n2 and n3 are turned on while the PMOS transistors p1, p2 and p3 and the NMOS transistors n4 and n5 are turned off; meanwhile, the output end has a 0 voltage, the nodes "e" and "f" have a voltage equal to −Vthp, i.e. one (V+) of the trip points of the Schmitt trigger has a voltage equal to (4/5)*Vcc+Vthn;

(V) If the input has a voltage lying between Vcc and Vcc+Vthp, the PMOS transistors p4 and p5 and the NMOS transistors n1, n2 and n3 are turned on while the PMOS transistors p1, p2 and p3 and the NMOS transistors n4 and n5 are turned off; meanwhile, the output end has a 0 voltage, and the nodes "e" and "f" have a voltage equal to −Vthp;

(VI) When the voltage at the input end falls and lies in a range between Vcc+Vthp and Vcc/2+Vthp, the PMOS transistors p1, p4 and p5 and the NMOS transistors n1, n2 and n3 are turned on while the PMOS transistors p2 and p3 and the NMOS transistors n4 and n5 are turned off; meanwhile, the output end has a 0 voltage, the node "e" has a voltage equal to Vcc/2, and the node "f" has a voltage equal to −Vthp;

(VII) When the voltage at the input end further falls and lies in a range between Vcc/2+Vthp and (1/5)*Vcc+Vthp, the PMOS transistors p1, p2, p4 and p5 and the NMOS transistors n1, n2 and n3 are turned on while the PMOS transistor p3 and the NMOS transistors n4 and n5 are turned off; meanwhile, the output end has a 0 voltage, the node "e" has a voltage equal to (2/5)*Vcc, and the node "f" has a voltage equal to (1/5)*Vcc; and (VIII) When the voltage at the input end further falls and lies in a range between (1/5)*Vcc+Vthp and 0, the PMOS transistors p1, p2 and p3 and the NMOS transistors n4 and n5 are turned on while the PMOS transistors p4 and p5 and the NMOS transistors n1, n2 and n3 are turned off; meanwhile, the output end has a voltage equal to Vcc, and the nodes "h" and "g" have a voltage equal to Vcc−Vthn, i.e. the other (V−) of the trip points of the Schmitt trigger has a voltage equal to (1/5)*Vcc+Vthp.

Figure 7:
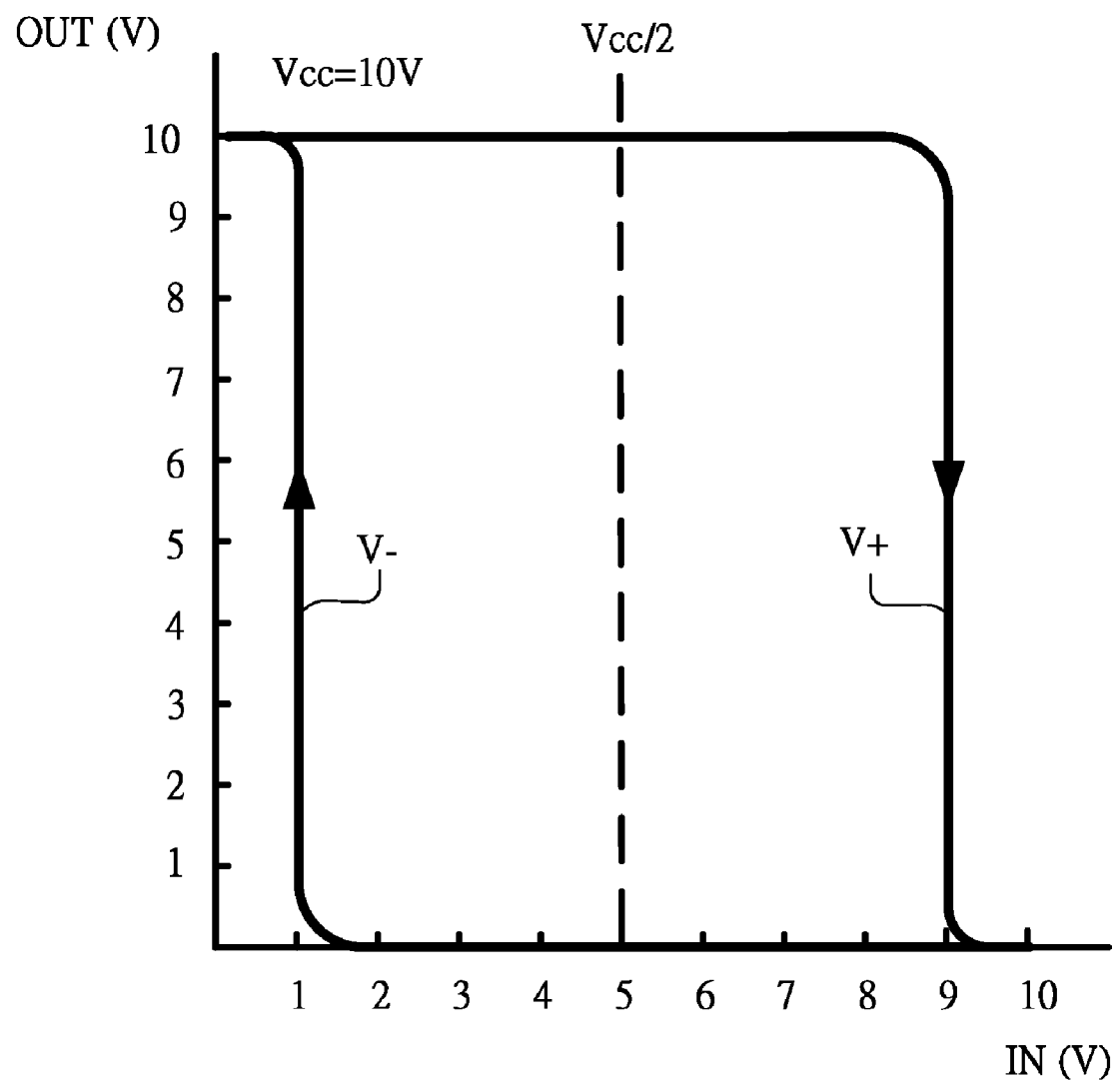
FIG. 7 is a plot illustrating a hysteresis transfer function of the Schmitt trigger of FIG. 6.

Refer to FIG. 7 which is a plot showing a hysteresis transfer function of the Schmitt trigger of FIG. 6. It is assumed that the power voltage Vcc is equal to 10V, the threshold voltage of the NMOS transistors Vthn is equal to 1V and the threshold voltage of the NMOS transistors Vthp is equal to −1V. Accordingly, it is understood that when the input voltage increases from 0 to Vcc, the trip point V+ at the output end is (4/5)*Vcc+Vthn, i.e. 9V; and when the input voltage decreases from Vcc to 0, the trip point V− at the output end is (1/5)*Vcc+Vthp, i.e. 1V. Since the difference between the two trip points V+ and V− may be as low as 0.1 Vcc and as high as 0.9 Vcc, respectively, the Schmitt trigger is suitable to be used in a level detection circuit.

According to the present invention, more than two PMOS transistors having the drains and sources thereof serially connected and coupled between a voltage source (Vcc) and an output end are provided. Although three PMOS transistors p1, p2 and p3 are included in the embodiment of FIG. 6 as an example, the count of the PMOS transistors is not necessarily three. However, the more the count of the serially connected PMOS transistors, the lower the trip point V− of the Schmitt trigger. Likewise, more than two NMOS transistors having the drains and sources thereof serially connected and coupled between the output end and ground are provided. Although three NMOS transistors n1, n2 and n3 are included in the embodiment of FIG. 6 as an example, the count of the NMOS transistors is not necessarily three. However, the more the count of the serially connected NMOS transistors, the higher the trip point V+ of the Schmitt trigger. Furthermore, if there are a number A of serially connected PMOS transistors, at most C=(A−1) PMOS feedback transistors are needed, wherein each PMOS feedback transistor, e.g. the transistor p4 or p5, is coupled between ground and a node between the drain and source of two adjacent PMOS transistors, e.g. the node "e" or "f", and has the gate thereof coupled to the output end. Likewise, if there are a number B of serially connected NMOS transistors, at most D=(B−1) NMOS feedback transistors are needed, wherein each NMOS feedback transistor, e.g. the transistor n4 or n5, is coupled between the voltage source and a node between the drain and source of two adjacent NMOS transistors, e.g. the node "g" or "h", and has the gate thereof coupled to the output end.

Figure 8:
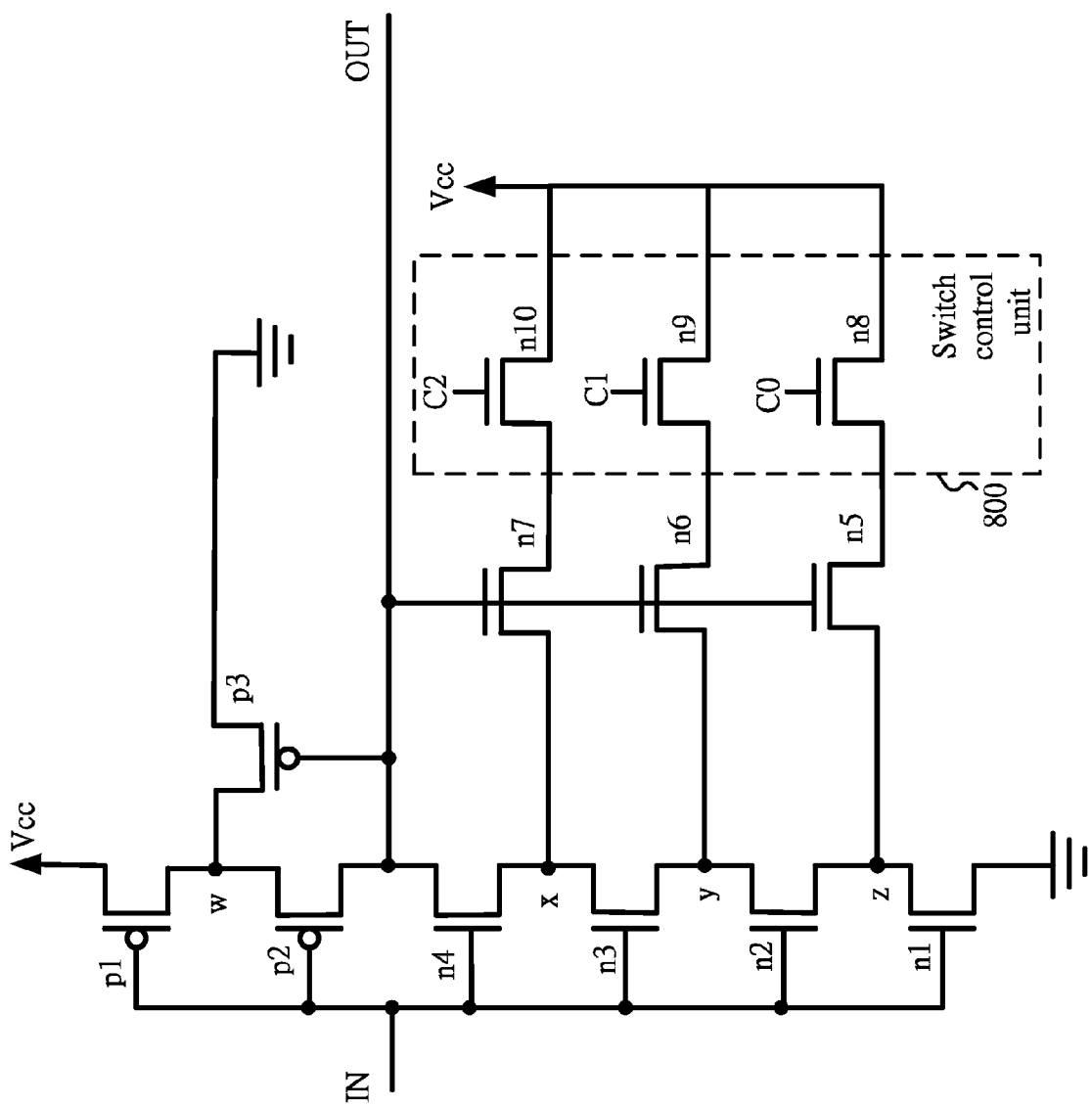
FIG. 8 is a circuit diagram illustrating another embodiment of a Schmitt trigger according to the present invention.

Please refer to FIG. 8 which illustrates a second embodiment of a Schmitt trigger according to the present invention. In this embodiment, a switch unit is provided in the Schmitt trigger for adjusting the hysteresis. Since the serially connected PMOS transistors and the serially connected NMOS transistors are operated in similar principles, only the adjustment of the trip point V+ conducted through NMOS transistors is illustrated herein. Those skilled in the art would understand how to adjust the trip point V− conducted through PMOS transistors based on the following descriptions.

The Schmitt trigger in this embodiment includes 10 NMOS transistors n1~n10 and 3 PMOS transistors p1~p3. The Schmitt trigger has an input end IN coupled to gates of the NMOS transistors n1, n2, n3 and n4 and the PMOS transistors p1 and p2. The source of the PMOS transistor p1 is coupled to a power voltage Vcc and the drain is coupled to a node "w". The node "w" is further coupled to the source of the PMOS transistor p2 which has the drain thereof coupled to the output end OUT. The output end OUT is further coupled to the drain of the NMOS transistor n4 which has the source thereof coupled to a node "x". The node "x" is further coupled to the drain of the NMOS transistor n3 which has the source thereof coupled to a node "y". The node "y" is further coupled to the drain of the NMOS transistor n2 which has the source thereof coupled to a node "z". The node "z" is further coupled to the drain of the NMOS transistor n1 which has the source thereof coupled to ground.

In the circuitry, the PMOS transistor p3 and the NMOS transistors n5, n6 and n7 may function as feedback FETs. The source of the PMOS transistor p3 is coupled to the node "w" and the gate and drain are coupled to the output end OUT and ground, respectively. On the other hand, the source of the NMOS transistor n5 is coupled to the node "z" and the gate and drain are coupled to the output end OUT and a switch control unit 800, respectively. The source of the NMOS transistor n6 is coupled to the node "y" and the gate and drain are coupled to the output end OUT and the switch control unit 800, respectively. The source of the NMOS transistor n7 is coupled to the node "x" and the gate and drain are coupled to the output end OUT and the switch control unit 800, respectively.

In this embodiment, the switch control unit 800 is coupled to the NMOS feedback transistors n5, n6 and n7 for controlling the connection states between the drains of the NMOS feedback transistors n5, n6 and n7 and the voltage source Vcc. The switch control unit 800 includes NMOS transistors n8, n9 and n10. The source of the NMOS transistor n8 is coupled to the drain of the NMOS transistor n5, and the drain and gate are coupled to the voltage source Vcc and the control end C0, respectively. The source of the NMOS transistor n9 is coupled to the drain of the NMOS transistor n6, and the drain and gate are coupled to the voltage source Vcc and the control end C1, respectively. The source of the NMOS transistor n10 is coupled to the drain of the NMOS transistor n7, and the drain and gate are coupled to the voltage source Vcc and the control end C2, respectively.

Figure 9:
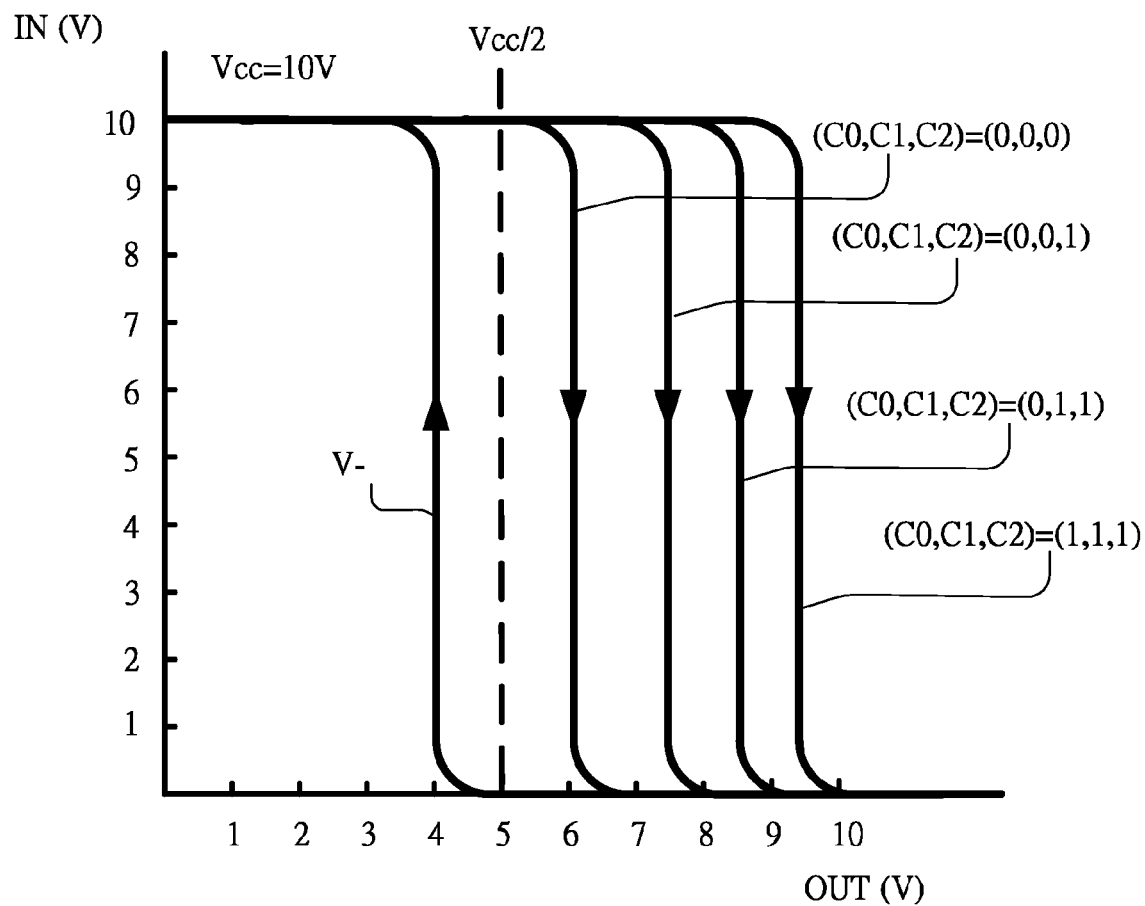
FIG. 9 is a plot illustrating a hysteresis transfer function of the Schmitt trigger of FIG. 8.

Please refer to FIG. 9 which is a plot showing a hysteresis transfer function of the Schmitt trigger of FIG. 8. It is assumed that the power voltage Vcc is equal to 10V, the threshold voltage of the NMOS transistors Vthn is equal to 1V and the threshold voltage of the NMOS transistors Vthp is equal to −1V. Accordingly, it is understood that when the input voltages at the control ends C0, C1 and C2 change, the trip points vary with the input voltage changing from 0V to Vcc. For example, when the input voltages at the control ends C0, C1 and C2 of the switch control unit 800 are all at high levels, it is understood that the node "x" will have a relatively high voltage according to the voltage divider rule. Meanwhile, the Schmitt trigger has the highest trip point V+. On the other hand, when the input voltages at the control ends C0, C1 and C2 of the switch control unit 800 are all at low levels, it is understood that the node "x" will have a relatively low voltage according to the voltage divider rule. Meanwhile, the Schmitt trigger has the lowest trip point V+. In other words, by selectively changing the input voltages at the control ends C0, C1 and C2, the trip point V+ of the Schmitt trigger can be dynamically adjusted.

In view of the foregoing, the present invention is advantageous in providing a Schmitt trigger suitable to be used in a level detection circuit. More particularly, the Schmitt trigger according to the present invention is capable of dynamically adjusting its trip points by way of a switch control unit.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Schmitt trigger, comprising:
a number A of first PMOS transistors having the drains and sources thereof serially connected and coupled between a voltage source and an output end, and having gates thereof coupled to an input end;
a number B of first NMOS transistors having the drains and sources thereof serially connected and coupled between the output end and ground, and having gates thereof coupled to the input end;
a number C of second PMOS transistors functioning as feedback transistors, each of which is coupled between ground and a node between the drain and the source of the first PMOS transistors and has the gate thereof coupled to the output end; and
a number D of second NMOS transistors functioning as feedback transistors, each of which is coupled between the voltage source and a node between the drain and the source of the first NMOS transistors and has the gate thereof coupled to the output end;
wherein A is greater than 2 and greater than C, and B is greater than 2 and greater than D.

2. The use of the Schmitt trigger according to claim 1 in a level detection circuit of a power-detecting module.

3. A Schmitt trigger, comprising:
a number A of first MOS transistors having the drains and sources thereof serially connected and coupled between a first voltage and an output end, and having gates thereof coupled to an input end;
a number B of second MOS transistors having the drains and sources thereof serially connected and coupled between the output end and a second voltage, and having gates thereof coupled to the input end;
a number C of third MOS transistors being the same type as the first MOS transistors and functioning as feedback transistors, each of which is coupled to a node between the drain and the source of the first MOS transistors and has the gate thereof coupled to the output end;
a number D of fourth MOS transistors being the same type as the second MOS transistors and functioning as feedback transistors, each of which is coupled to a node between the drain and the source of the second MOS transistors and has the gate thereof coupled to the output end; and
a switch control unit coupled to the drains of the fourth MOS transistors for selectively connecting the drains of the fourth MOS transistors to the second voltage;
wherein A is greater than C, and B is greater than D.

4. The use of the Schmitt trigger according to claim 3 in a level detection circuit of a power-detecting module.

5. A Schmitt trigger, comprising:
a number A of first PMOS transistors having the drains and sources thereof serially connected and coupled between a voltage source and an output end, and having gates thereof coupled to an input end;
a number B of first NMOS transistors having the drains and sources thereof serially connected and coupled between the output end and ground, and having gates thereof coupled to the input end;
a number C of second PMOS transistors functioning as feedback transistors, each of which is coupled to a node between the drain and the source of the first PMOS transistors and has the gate thereof coupled to the output end;
a number D of second NMOS transistors functioning as feedback transistors, each of which is coupled to a node between the drain and the source of the first NMOS transistors and has the gate thereof coupled to the output end; and
a switch control unit coupled to the drains of the second NMOS transistors for selectively connecting the drains of the second NMOS transistors to the voltage source;
wherein A is greater than C, and B is greater than D.

6. The use of the Schmitt trigger according to claim 5 in a level detection circuit of a power-detecting module.

* * * * *